United States Patent
Kang et al.

(10) Patent No.: US 12,454,201 B1
(45) Date of Patent: Oct. 28, 2025

(54) PNEUMATIC CONTROLLER FOR VEHICLE SEATS

(71) Applicant: HYUNDAI TRANSYS INC., Seosan-si (KR)

(72) Inventors: Gu Chang Kang, Hwaseong-si (KR); Ui Jeong Lee, Hwaseong-si (KR)

(73) Assignee: HYUNDAI TRANSYS INC., Seosan-si (KR)

( * ) Notice: Subject to any disclaimer, the term of this patent is extended or adjusted under 35 U.S.C. 154(b) by 0 days.

(21) Appl. No.: 19/084,763

(22) Filed: Mar. 20, 2025

(30) Foreign Application Priority Data

Apr. 26, 2024 (KR) .......................... 10-2024-0055833

(51) Int. Cl.
*B60N 2/02* (2006.01)
*B60R 16/027* (2006.01)
*B60N 2/90* (2018.01)
*H05K 1/18* (2006.01)

(52) U.S. Cl.
CPC .......... *B60N 2/0224* (2013.01); *B60R 16/027* (2013.01); *B60N 2002/924* (2018.02); *H05K 1/181* (2013.01); *H05K 2201/10151* (2013.01)

(58) Field of Classification Search
CPC ............ B60N 2/0224; B60N 2002/924; B60R 16/027; H05K 1/181; H05K 2201/10151
See application file for complete search history.

(56) References Cited

U.S. PATENT DOCUMENTS

| | | | | |
|---|---|---|---|---|
| 6,098,000 | A  * | 8/2000 | Long | A47C 4/54 307/10.6 |
| 7,558,473 | B2 * | 7/2009 | Shin | H04N 23/68 348/208.7 |
| 9,080,581 | B2 * | 7/2015 | Bocsanyi | B60N 2/914 |
| 9,097,365 | B2 * | 8/2015 | Larsen | F16K 99/0028 |
| 10,073,471 | B2 * | 9/2018 | Derjong | G05D 16/20 |
| 11,504,293 | B2 * | 11/2022 | Weber | B60N 2/976 |
| 12,156,592 | B2 * | 12/2024 | Kang | H05K 1/14 |
| 2005/0067868 | A1* | 3/2005 | Kern | F16K 11/0716 297/284.6 |

* cited by examiner

*Primary Examiner* — Dustin T Nguyen
(74) *Attorney, Agent, or Firm* — Quantum Patent Law Firm; Seongyoune Kang

(57) ABSTRACT

Disclosed is a pneumatic controller for vehicle seats, in which a main printed circuit board is mounted in a housing, and a plunger of an actuator pulls or pushes a sub-printed circuit board by a switching signal, in a state in which the sub-printed circuit board provided with pressure sensors is fastened to the main printed circuit board so as to be slidably movable and exchange electrical signals with the main printed circuit board, thereby enabling the pressure sensors on the sub-printed circuit board to move to a different position where the pressure sensors are capable of sensing air pressure, and accordingly being capable of easily detecting not only air pressure during air intake and exhaust for first air cells installed in a seat cushion and second air cells installed in bolsters bus also air pressure during air intake and exhaust for third air cells installed in a seat back.

12 Claims, 8 Drawing Sheets

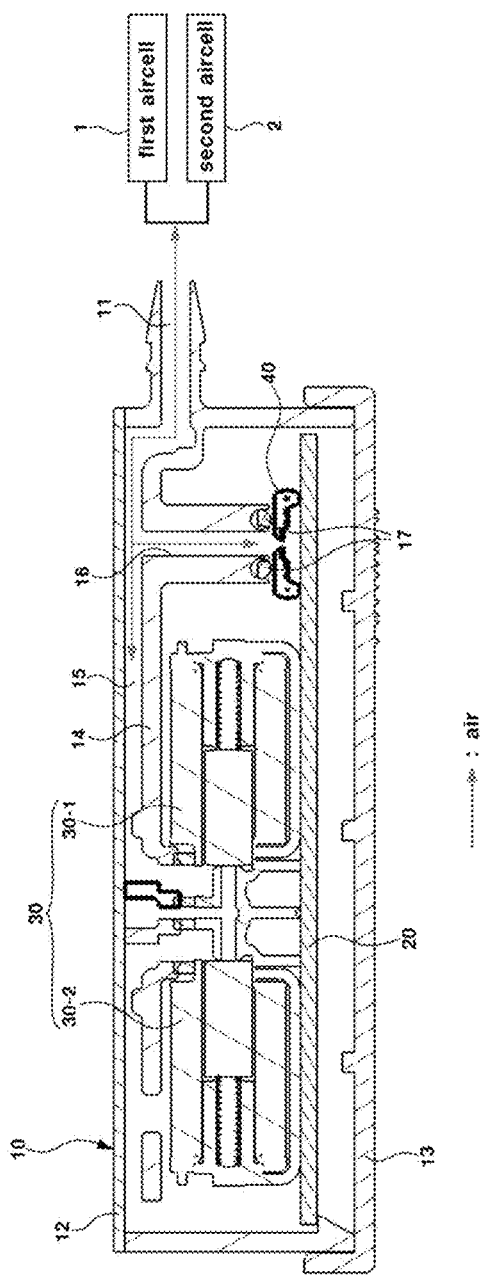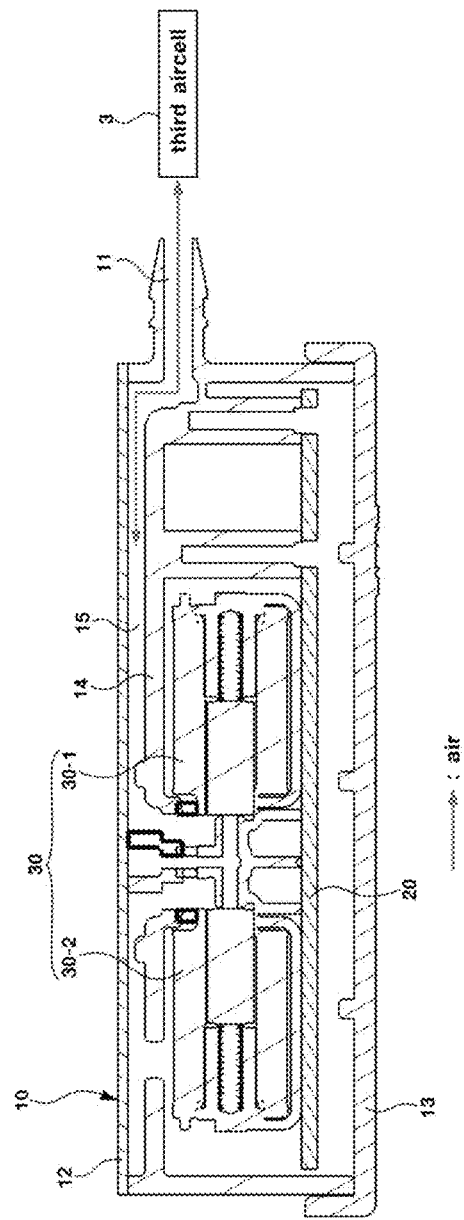

PNEUMATIC CONTROLLER FOR VEHICLE SEATS

CROSS-REFERENCE TO RELATED APPLICATION

This application claims priority under 35 U.S.C. § 119(a) from Korean Patent Application No. 10-2024-0055833, filed on Apr. 26, 2024, the entire contents of which are incorporated herein by reference.

BACKGROUND

(a) Technical Field

The present disclosure relates to a pneumatic controller for vehicle seats. More particularly, it relates to a pneumatic controller for vehicle seats that may change the arrangement position of pressure sensors mounted on a printed circuit board (PCB) of the pneumatic controller to a position where the pressure sensors are capable of sensing air.

(b) Background Art

As is well known, a vehicle seat includes a seat back that supports the upper body of a passenger, a seat cushion that enables the passenger to be seated thereon, a headrest that supports the neck and head of the passenger, etc., and various seat position adjustment devices and convenience devices are installed inside and outside the seat.

The seat back is manufactured with a structure in which bolsters protruding to surround side portions of the upper body of the passenger are formed on both sides, and the seat cushion is manufactured with a structure in which bolsters protruding to surround side portions of the lower body of the passenger are formed on both sides.

Recently, a so-called "Ergo Motion seat" in which the air pressure of air cells installed inside a seat cushion, a seat back, and bolsters is adjusted to provide optimal seating comfort of the seat to suit the body type of a driver or a passenger is installed in vehicles.

For this purpose, first air cells may be installed in the seat cushion, second air cells are installed in the respective bolsters formed on both sides of the seat cushion and the seat back, and third air cells configured to support the passenger's waist may be installed in the seat back.

For example, in the case of the Ergo Motion seat, at least two first air cells may be installed in the seat cushion, at least one air cell may be installed in each of bolsters formed on both sides of the seat cushion and the seat back, at least three air cells may be installed in the seat back, and thus, a total of seven or more air cells may be employed.

Accordingly, by selectively controlling intake and exhaust air amounts for the first air cells installed in the seat cushion, the second air cells installed in the bolsters, and the third air cells installed in the seat back, the seating posture of a driver or a passenger on the seat may be adjusted.

For reference, the operating modes of the Ergo Motion seat include a massage mode in which the driver's or passenger's waist is massaged by repeatedly adjusting the intake and exhaust air amounts of the third air cells, a drive mode in which the height of the seat cushion is adjusted by inflating the first air cells and the bolsters surround the driver's or passenger's body by inflating the second air cells, a getting on/off mode that enables the driver or the passenger to conveniently get on and off the vehicle by deflating the second air cells and the bolsters, and a smart fit mode that enables the air amounts of the first, second, and third air cells to be automatically adjusted depending on a seating posture set by the driver or the passenger.

Here, the configuration of a conventional pneumatic controller that performs pneumatic control of the Ergo Motion seat is as follows.

FIG. 1 is a perspective view illustrating the conventional pneumatic controller, FIG. 2 is a cross-sectional view illustrating the conventional pneumatic controller, and FIGS. 3 and 4 are longitudinal-sectional views taken along lines A-A and B-B of FIG. 2, respectively.

The conventional pneumatic controller performs pneumatic control for each operating mode of the Ergo Motion seat, and includes a housing 10, a printed circuit board 20, a plurality of valve units 30, and pressure sensors 40.

The housing 10 includes a main body 12 having air inlet port (not shown) and air outlet ports 11 formed therein, and a cover 13 coupled to an opening formed in the main body 12.

The printed circuit board 20 is fixedly mounted within the main body 12 of the housing 10, and controls opening and closing of the valve units 30 based on a switching signal for Ergo Motion and detection signals of the pressure sensors 40.

As shown in FIGS. 3 and 4, the valve units 30 include intake valves 30-1 and exhaust valves 30-2, and are arranged on one side of the printed circuit board 20 so as to be openable and closable.

For example, the valve units 30 may include, as shown in FIG. 2, a first valve unit 31 and a second valve unit 32 that control air intake and exhaust for two first air cells 1 installed in a seat cushion, a third valve unit 33 and a fourth valve unit 34 that control air intake and exhaust for second air cells 2 installed in respective bolsters, and a fifth valve unit 35, a sixth valve unit 36, and a seventh valve unit 37 that control air intake and exhaust for three third air cells 3 installed in a seat back.

The pressure sensors 40 are conductively soldered to one side of the printed circuit board 20 at equal intervals, and detect the current pressure of air filling each air cell in real time.

For example, the pressure sensors 40 may include, as shown in FIG. 2, a first pressure sensor 41 and a second pressure sensor 42 arranged to be in communication with air outlets of the first valve unit 31 and the second valve unit 32 to detect air pressure during air intake and exhaust into and from the two first air cells 1 installed in the seat cushion, and a third pressure sensor 43 and a fourth pressure sensor 44 arranged to be in communication with air outlets of the third valve unit 33 and the fourth valve unit 34 to detect air pressure during air intake and exhaust into and from the second air cells 2 installed in the respective bolsters.

Here, air guides 14 that guide air to the air outlet ports 11 are mounted in the housing 10, air flow paths 15 that communicate with the air outlet ports 11 are formed between the air guides 14 and the inner wall of the housing 10, and particularly, as seen in FIG. 3, pressure sensing passages 16 to guide air to the first to fourth pressure sensors 41, 42, 43, and 44 are formed at predetermined positions of the air guides 14.

Therefore, before air is supplied to the first air cells 1 and the second air cells 2, when air fills the first air cells 1 and the second air cells 2, and when air is exhausted from the first air cells 1 and the second air cells 2, air also flows into the pressure sensing passages 16, thereby enabling the first to fourth pressure sensors 41, 42, 43, and 44 to detect air pressure.

Considering that the pressure sensors 40 are expensive components, and the third air cells 3, which are inflated and deflected only in the massage mode, are less frequently used than the first and second air cells 1 and 2, as shown in FIG. 4, no pressure sensor is disposed at the air outlets of the fifth valve unit 35, the sixth valve unit 36, and the seventh valve unit 37, which control air intake and exhaust for the three third air cells 3 installed in the seat back.

Of course, air guides 14 that guide air to the air outlet ports 11 are also installed at the air outlets of the fifth valve unit 35, the sixth valve unit 36, and the seventh valve unit 37 within the housing 10, and air flow paths 15 that communicate with the air outlet ports 11 are formed between the air guides 14 and the inner wall of the housing 10.

Here, the operation flow of the conventional pneumatic controller configured as above is as follows.

Air Filling and Exhaust Operation of First Air Cells

When the intake valves 30-1 of the first valve unit 31 and the second valve unit 32 among the valve units 30 are opened, air may be supplied to fill the first air cells 1 through the air flow paths 15 between the inner wall of the housing 10 and the air guides 14 and the air outlet ports 11, so that the seat cushion may be expanded, and on the other hand, when the exhaust valves 30-2 of the first valve unit 31 and the second valve unit 32 are opened, air in the first air cells 1 is exhausted along the air outlet ports 11 and the air flow paths 15, so that the seat cushion may be contracted.

At this time, when air fills the first air cells 1, air having passed through the intake valves 30-1 of the first valve unit 31 and the second valve unit 32 also flows into the pressure sensing passages 16, and thus, the first pressure sensor 41 and the second pressure sensor 42 among the pressure sensors 40 may detect air pressure.

In detail, among the pressure sensors 40, the first pressure sensor 41 and the second pressure sensor 42 detect air pressure before the first air cells 1 are filled with a set amount of air and air pressure after the first air cells 1 have been filled with the set amount of air in real time, and transmit a detection signal to the printed circuit board 20.

Accordingly, when air is exhausted from the first air cells 1, the exhaust valves 30-2 of the first valve unit 31 and the second valve unit 32 may be opened for air exhaust and the opening operation time of the exhaust valves 30-2 may be controlled to be limited by a control signal from the printed circuit board 20.

For example, the opening operation time of the exhaust valves 30-2 may be limited until the first pressure sensor 41 and the second pressure sensor 42 detect a pre-detected air pressure (e.g., air pressure detected before the first air cells 1 are filled with the set amount of air).

In other words, after the exhaust valves 30-2 of the first valve unit 31 and the second valve unit 32 have been opened for air exhaust, when the air pressure detected in real time by the first pressure sensor 41 and the second pressure sensor 42 reaches the pre-detected air pressure (e.g., the air pressure detected before the first air cells 1 are filled with the set amount of air), the exhaust valves 30-2 of the first valve unit 31 and the second valve unit 32 are controlled to be closed by the control signal from the printed circuit board 20.

Therefore, the amount of air exhausted from the first air cells 1 is adjusted to the same level as the amount of air filling the first air cells 1, so that the amount of expansion and the amount of contraction of the seat cushion may always be adjusted to be constant.

Consequently, the amount of expansion of the seat cushion depending on air intake into the first air cells 1 and the amount of contraction of the seat cushion depending on air exhaust from the first air cells 1 are controlled to be the same, and thus, the seat cushion may accurately return to an original position thereof (a state before expansion) after being expanded.

Air Filling and Exhaust Operation of Second Air Cells

When the intake valves 30-1 of the third valve unit 33 and the fourth valve unit 34 among the valve units 30 are opened, air may be supplied to fill the second air cells 2 through the air flow paths 15 between the inner wall of the housing 10 and the air guides 14 and the air outlet ports 11, so that the bolsters may be expanded, and on the other hand, when the exhaust valves 30-2 of the third valve unit 33 and the fourth valve unit 34 are opened, air in the second air cells 2 is exhausted along the air outlet ports 11 and the air flow paths 15, so that the bolsters may be contracted.

At this time, when air fills the second air cells 2, air having passed through the intake valves 30-1 of the third valve unit 33 and the fourth valve unit 34 also flows into the pressure sensing passages 16, and thus, the third pressure sensor 43 and the fourth pressure sensor 44 among the pressure sensors 40 may detect air pressure.

In detail, among the pressure sensors 40, the third pressure sensor 43 and the fourth pressure sensor 44 detect air pressure before the second air cells 2 are filled with a set amount of air and air pressure after the second air cells 2 have been filled with the set amount of air in real time, and transmit a detection signal to the printed circuit board 20.

Accordingly, when air is exhausted from the second air cells 2, the exhaust valves 30-2 of the third valve unit 33 and the fourth valve unit 34 may be opened for air exhaust and the opening operation time of the exhaust valves 30-2 may be controlled to be limited by a control signal from the printed circuit board 20.

For example, the opening operation time of the exhaust valves 30-2 may be limited until the third pressure sensor 43 and the fourth pressure sensor 44 detect a pre-detected air pressure (e.g., air pressure detected before the second air cells 2 are filled with the set amount of air).

In other words, after the exhaust valves 30-2 of the third valve unit 33 and the fourth valve unit 34 have been opened for air exhaust, when the air pressure detected in real time by the third pressure sensor 43 and the fourth pressure sensor 44 reaches the pre-detected air pressure (e.g., the air pressure detected before the second air cells 2 are filled with the set amount of air), the exhaust valves 30-2 of the third valve unit 33 and the fourth valve unit 34 are controlled to be closed by the control signal from the printed circuit board 20.

Therefore, the amount of air exhausted from the second air cells 2 is adjusted to the same level as the amount of air filling the second air cells 1, so that the amount of expansion and the amount of contraction of the bolsters may always be adjusted to be constant.

Consequently, the amount of expansion of the bolsters depending on air intake into the second air cells 2 and the amount of contraction of the bolsters depending on air exhaust from the second air cells 2 are controlled to be the same, and thus, the bolsters may accurately return to original positions thereof (a state before expansion) after being expanded.

Air Filling and Exhaust Operation of Third Air Cells

As described above, considering that the pressure sensors 40 are expensive components, and the third air cells 3, which are inflated and deflated only in the massage mode, are less frequently used than the first and second air cells 1 and 2, as shown in FIG. 4, no pressure sensor is disposed at the air outlets of the fifth valve unit 35, the sixth valve unit 36, and the seventh valve unit 37, which control air intake and exhaust for the three third air cells 3 installed in the seat back.

When the intake valves 30-1 of the fifth valve unit 35, the sixth valve unit 36, and the seventh valve unit 37 among the valve units 30 are opened, air may be supplied to fill the third air cells 3 through the air flow paths 15 between the inner wall of the housing 10 and the air guides 14 and the air outlet ports 11, so that a lumbar support of the seat back may be expanded, and on the other hand, when the exhaust valves 30-2 of the fifth valve unit 35, the sixth valve unit 36, and the seventh valve unit 37 are opened, air in the third air cells 3 is exhausted along the air outlet ports 11 and the air flow paths 15, so that the lumbar support of the seat back may be contracted.

At this time, a time for which a set amount of air is supplied to the third air cells 3 and a time for which the set amount of air is exhausted from the third air cells 3 are controlled to be the same by control signals from the printed circuit board 20.

For this purpose, the opening operation time of the intake valves 30-1 of the fifth valve unit 35, the sixth valve unit 36, and the seventh valve unit 37 to supply the set amount of air to the third air cells 3 is controlled to be limited by a control signal from the main printed circuit board 110, and the opening operation time of the exhaust valves 30-2 of the fifth valve unit 35, the sixth valve unit 36, and the seventh valve unit 37 to exhaust the set amount or air from the third air cells 3 is controlled to be limited by a control signal from the main printed circuit board 110.

However, because the air intake time and the air exhaust time of the third air cells 3 are controlled only by controlling the opening operation time of the intake valves 30-1 of the fifth valve unit 35, the sixth valve unit 36, and the seventh valve unit 37 and the opening operation time of the exhaust valves 30-2 of the fifth valve unit 35, the sixth valve unit 36, and the seventh valve unit 37 without detecting air pressure for air intake and exhaust for the third air cells 3 by pressure sensors, there is a problem in which the amount of expansion and the amount of contraction of the lumbar support of the seat back do not match exactly.

In other words, when the third air cells 3 installed in the lumbar support of the seat back are repeatedly inflated and deflated for the massage mode during Ergo Motion, an error occurs between the amount of expansion and the amount of contraction of the third air cells 3 installed in the lumbar support of the seat back because only the air intake time and the air exhaust time of the third air cells 3 are controlled without detecting the air pressure for air intake and exhaust for the third air cells 3, i.e., without considering the air pressure that changes over time.

Therefore, due to the error between the amount of air filling the third air cells 3 and the amount of air exhausted from the third air cells 3, there is a problem in which, when the massage mode is terminated, the lumbar support of the seat back does not accurately return to an original position thereof (a state before expansion) after being expanded.

Accordingly, a method of detecting air pressure using pressure sensors during air intake and exhaust into and from the third air cells 3 is required to control the amount of expansion and the amount of contraction of the third air cells 3 installed in the lumbar support of the seat back to be the same.

The above information disclosed in this Background section is only for enhancement of understanding of the background of the disclosure and therefore it may contain information that does not form the prior art that is already known in this country to a person of ordinary skill in the art.

SUMMARY OF THE DISCLOSURE

The present disclosure has been made in an effort to solve the above-described problems associated with conventional art, and it is an object of the present disclosure to provide a pneumatic controller for at least one vehicle seat, in which a main printed circuit board is mounted in a housing of the pneumatic controller, and a plunger of an actuator pulls or pushes a sub-printed circuit board by a switching signal, in a state in which the sub-printed circuit board provided with pressure sensors mounted thereon is fastened to the main printed circuit board so as to be slidably movable and exchange electrical signals with the main printed circuit board, thereby enabling the pressure sensors mounted on the sub-printed circuit board to move to a position where the pressure sensors are capable of sensing air pressure, and accordingly being capable of easily detecting not only air pressure during air intake and exhaust into and from first air cells installed in a seat cushion and second air cells installed in bolsters but also air pressure during air intake and exhaust into and from third air cells installed in a seat back.

In one aspect, the present disclosure provides a pneumatic controller for vehicle seats including a housing having a plurality of air outlet ports formed in one side thereof, a main printed circuit board having a structure provided with a slide hole formed therein, and mounted in the housing, a plurality of valve units arranged on the main printed circuit board so as to be openable and closable, a sub-printed circuit board inserted into the slide hole to be movable rectilinearly, a plurality of pressure sensors provided fewer in number than the plurality of valve units and mounted at predetermined intervals on the sub-printed circuit board, and an actuator mounted on the main printed circuit board to push the sub-printed circuit board in one direction or pull the sub-printed circuit board in an opposite direction.

In a preferred embodiment, the slide hole of the main printed circuit board may be formed to be open-ended on one side so that the sub-printed circuit board is insertable thereinto.

In another preferred embodiment, an inner perimeter of the slide hole of the main printed circuit board may be provided as a slide edge, and a slide groove may be formed on an outer perimeter of the sub-printed circuit board so that the slide edge is insertable thereinto.

In still another preferred embodiment, a first conductive pattern may be formed on a surface along the slide edge of the main printed circuit board, and a second conductive pattern may be formed along the outer perimeter of the sub-printed circuit board so as to be conductively in contact with the first conductive pattern when the sub-printed circuit board is inserted into the slide hole.

In yet another preferred embodiment, the pneumatic controller may further comprise dummy blocks having the same height as the plurality of pressure sensors and may be provided between the plurality of pressure sensors on a surface of the sub-printed circuit board.

In still yet another preferred embodiment, the pneumatic controller may further comprise sealing members and air guides configured to guide air to the pressure sensors and including pressure sensing passages. The sealing members may be attached to lower ends of pressure sensing passages of air guides, and the sealing members may be in close contact with the pressure sensors or the dummy blocks to maintain airtightness when the sub-printed circuit board is moved rectilinearly.

In a further preferred embodiment, the actuator may be a solenoid valve-type actuator including a plunger connected to the sub-printed circuit board to be driven forward or backward.

In another further preferred embodiment, the pneumatic controller may further comprise a fastening bracket mounted at a front end of the sub-printed circuit board so that the plunger is fastenable thereto.

In still another further preferred embodiment, the pneumatic controller may further comprise a pair of fastening ends formed on an upper end of the fastening bracket, and a fastening groove formed along an outer circumferential surface of the plunger so that the pair of fastening ends is insertable thereinto.

In yet another further preferred embodiment, the pneumatic controller may further comprise a spring configured to provide an elastic restoring force when the sub-printed circuit board is moved to return to an original position thereof, and connected between a bottom surface of the main printed circuit board and a bottom surface of the sub-printed circuit board.

In still yet another further preferred embodiment, when the sub-printed circuit board is pushed by the actuator and brought back to an original position where the sub-printed circuit board was located before being moved, a first pressure sensor and a second pressure sensor among the plurality of pressure sensors mounted on the sub-printed circuit board may be arranged to be aligned with air outlets of a first valve unit and a second valve unit among the plurality of valve units so as to detect air pressure during air intake and exhaust into and from first air cells installed in a seat cushion, and a third pressure sensor and a fourth pressure sensor among the plurality of pressure sensors mounted on the sub-printed circuit board may be arranged to be aligned with air outlets of a third valve unit and a fourth valve unit among the plurality of valve units so as to detect air pressure during air intake and exhaust into and from second air cells installed in corresponding bolsters.

In a still further preferred embodiment, when the sub-printed circuit board is pulled by the actuator and brought to a different position offset by a set distance from an original position, a first pressure sensor, a second pressure sensor, and a third pressure sensor among the plurality of pressure sensors mounted on the sub-printed circuit board may be arranged to be aligned with air outlets of a fifth valve unit, a sixth valve unit, and a seventh valve unit respectively among the plurality of valve units so as to detect air pressure during air intake and exhaust into and from third air cells installed in a seat back.

Other aspects and preferred embodiments of the disclosure are discussed infra.

The above and other features of the disclosure are discussed infra.

BRIEF DESCRIPTION OF THE DRAWINGS

The above and other features of the present disclosure will now be described in detail with reference to certain exemplary embodiments thereof illustrated the accompanying drawings which are given hereinbelow by way of illustration only, and thus are not limitative of the present disclosure, and wherein:

FIG. 3 is a longitudinal-sectional view taken along line A-A of FIG. 2;

FIG. 4 is a longitudinal-sectional view taken along line B-B of FIG. 2;

Figure 1:
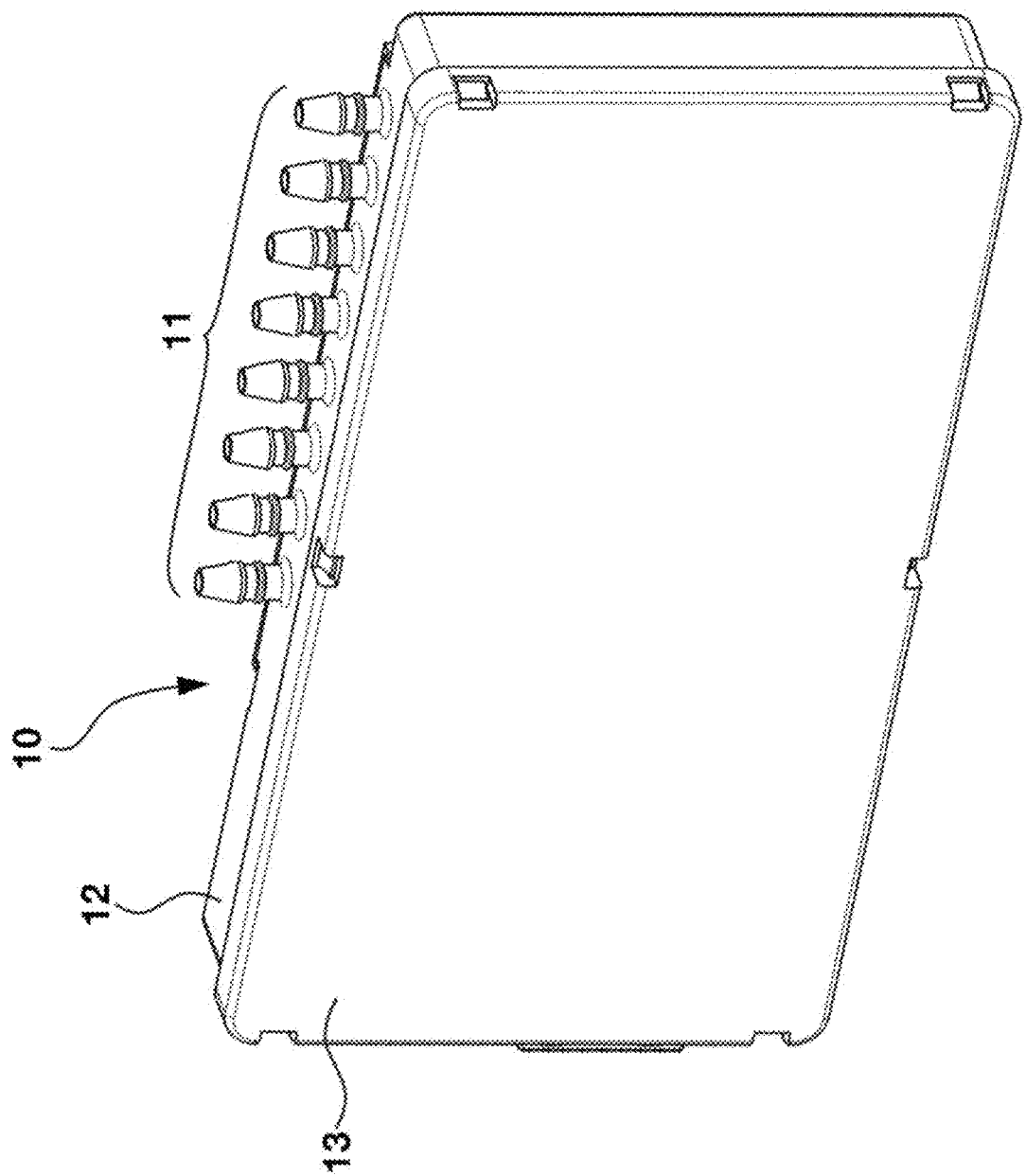
FIG. 1 is a perspective view illustrating a conventional pneumatic controller.
Figure 2:
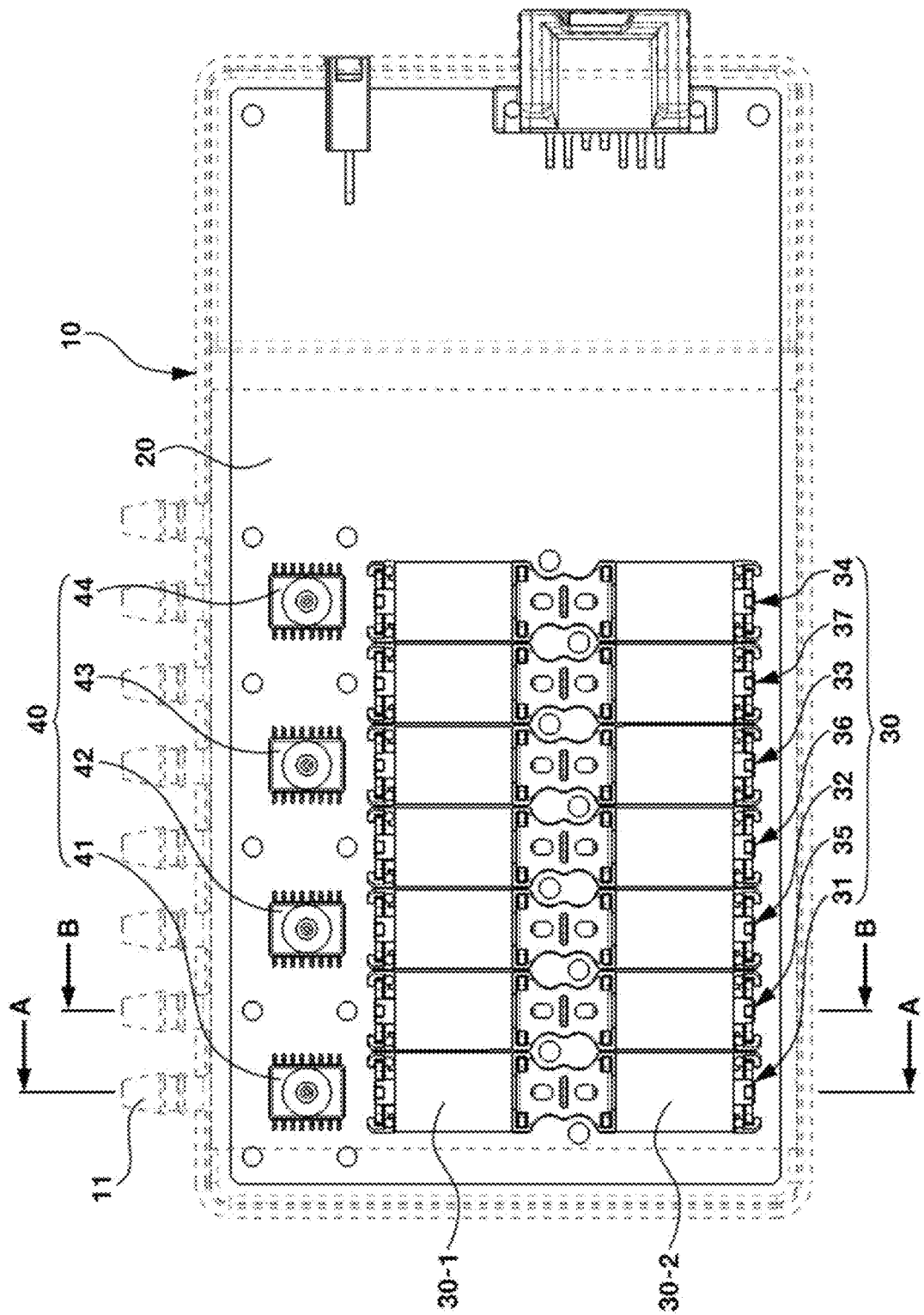
FIG. 2 is a cross-sectional view illustrating the conventional pneumatic controller.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

Specific structural or functional descriptions set forth in the embodiments of the present disclosure will be merely exemplarily given to describe the embodiments depending on the concept of the present disclosure, and the embodiments depending on the concept of the present disclosure may be embodied in different forms. Further, the present disclosure should not be construed as being limited to the embodiments set forth herein, and it will be understood that the present disclosure includes all modifications, equivalents, or substitutes included in the spirit and technical scope of the disclosure.

In the following description of the embodiments, terms, such as "first," "second," and the like, are used only to describe various elements, and these elements should not be construed as being limited by these terms. These terms are used only to distinguish one element from other elements. For example, a first element described hereinafter may be termed a second element, and similarly, a second element described hereinafter may be termed a first element, without departing from the scope of the disclosure.

Wherever possible, the same reference numbers will be used throughout the following description to refer to the same or like parts. The terminology used herein is for the purpose of describing particular embodiments only and is not intended to be limiting. As used herein, singular forms may be intended to include plural forms as well, unless the context clearly indicates otherwise. The terms "comprises," "comprising," "including," and "having" are inclusive and therefore specify the presence of stated features, integers, operations, operations, elements, components, and/or combinations thereof, but do not preclude the presence or addition of one or more other features, integers, operations, operations, elements, components, and/or combinations thereof.

Hereinafter, exemplary embodiments of the present disclosure will be described in detail with reference to the accompanying drawings.

Figure 5:
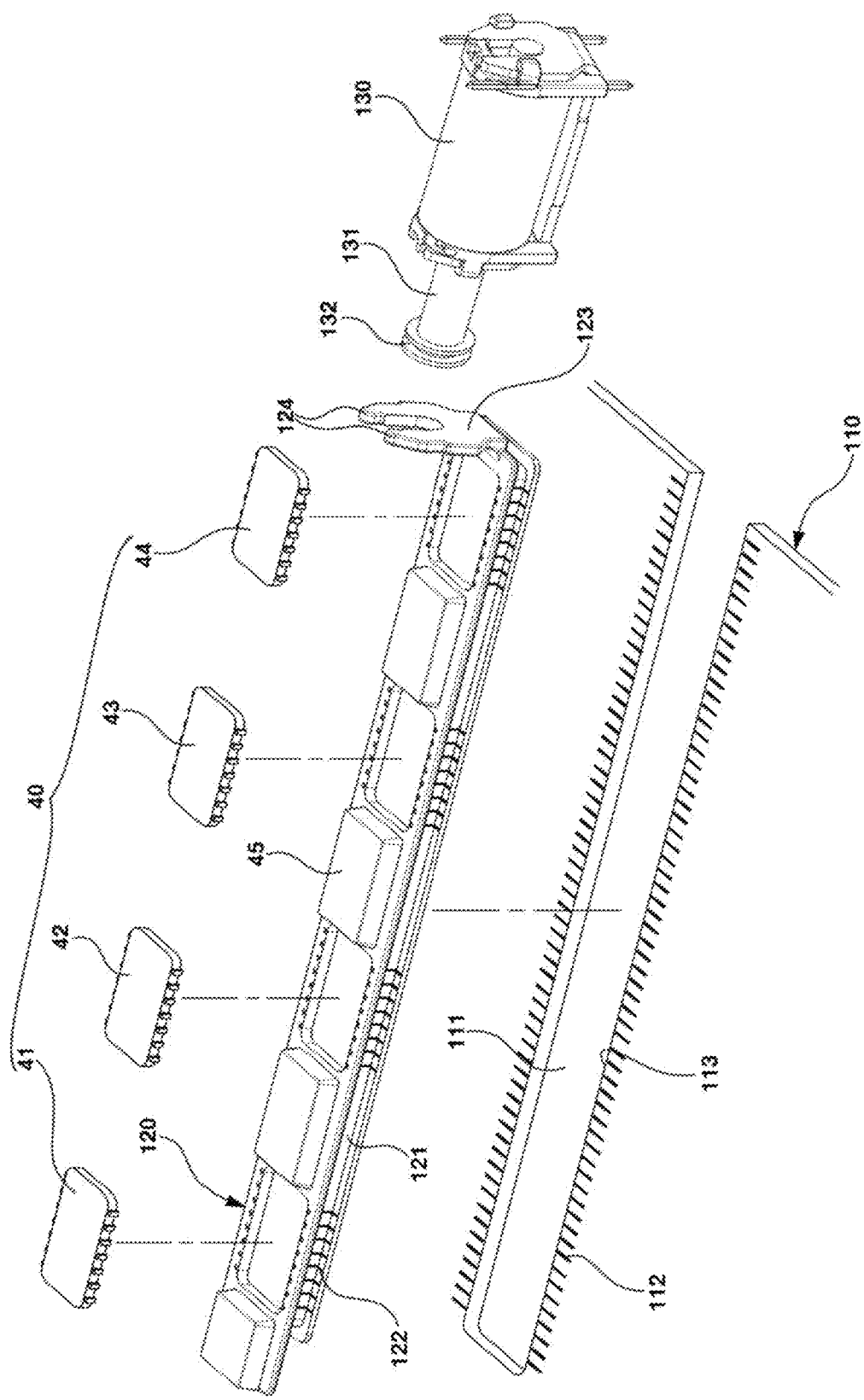
FIG. 5 is an exploded perspective view illustrating internal components of a pneumatic controller for vehicle seats according to the present disclosure.
Figure 6:
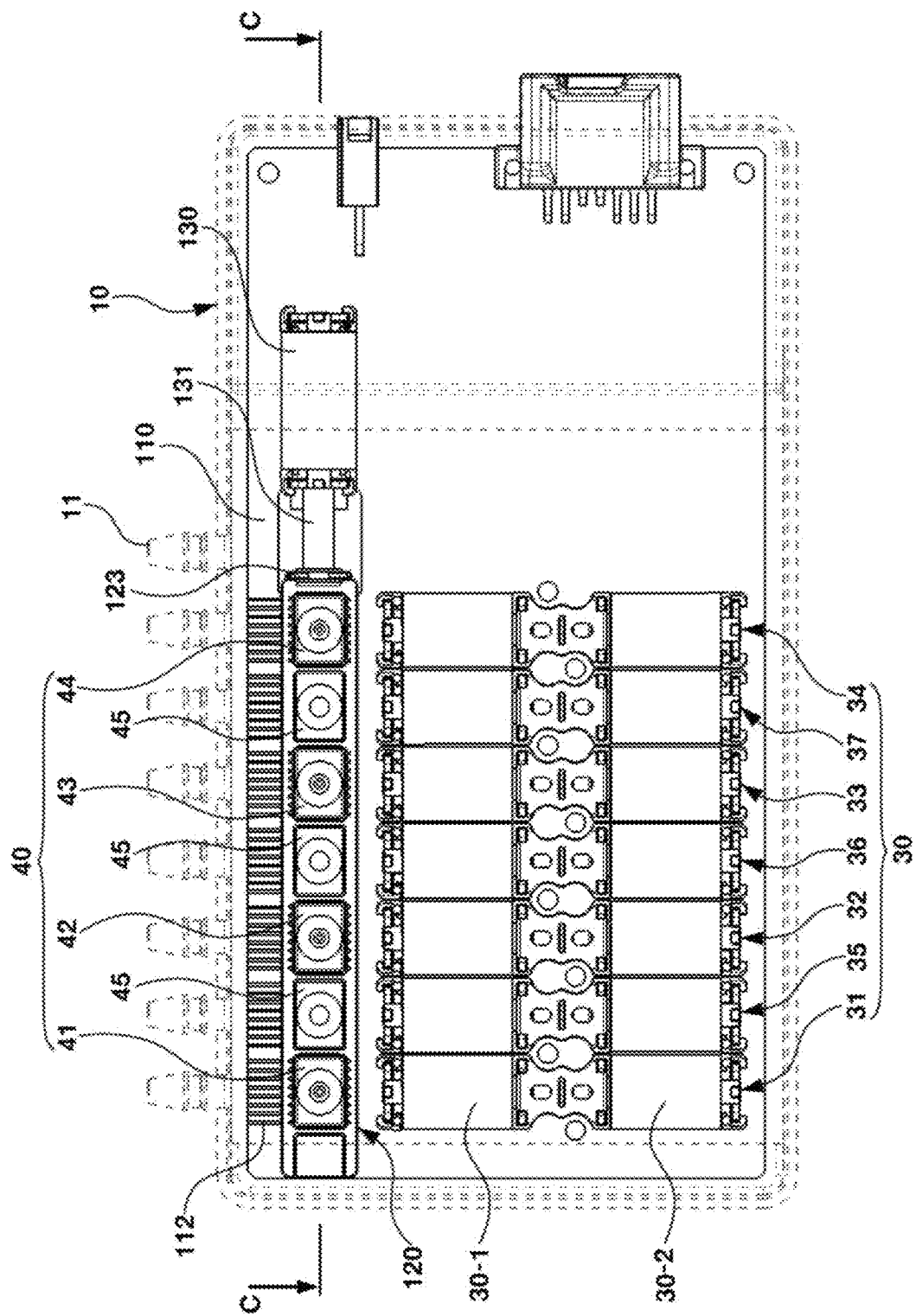
FIG. 6 is a cross-sectional view illustrating a state before the position of pressure sensors of the pneumatic controller for vehicle seats according to the present disclosure is moved.
Figure 7:
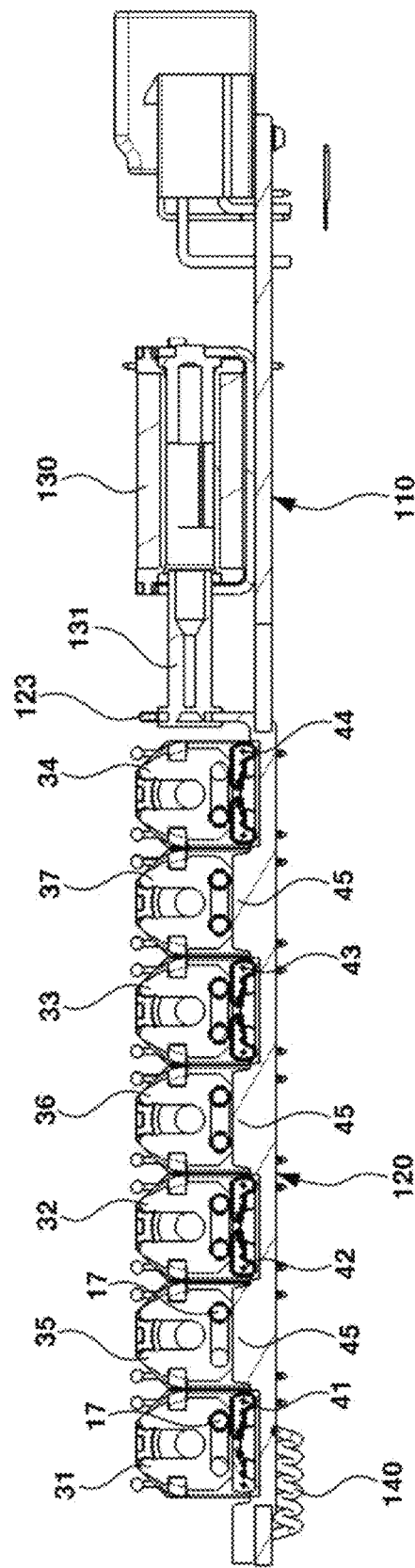
FIG. 7 is a longitudinal-sectional view taken along line C-C of FIG. 6, illustrating the state before the position of the pressure sensors of the pneumatic controller for vehicle seats according to the present disclosure is moved.

FIG. 5 is an exploded perspective view illustrating internal components of a pneumatic controller for vehicle seats according to the present disclosure, and FIGS. 6 and 7 are sectional views illustrating a state before the position of pressure sensors of the pneumatic controller for vehicle seats according to the present disclosure is moved.

A housing 10 of the pneumatic controller according to the present disclosure is provided in a structure in which a plurality of air outlet ports 11 is formed on one side in addition to an air inlet port (not shown).

A main printed circuit board 110 that controls opening and closing of a plurality of valve units 30 based on a switching signal for the Ergo Motion of a seat and detection signals of pressure sensors 40.

A slide hole 111 is formed in one side of the main printed circuit board 110, and the slide hole 111 is formed to be open-ended on one side so that a sub-printed circuit board 120 may be inserted thereinto.

The plurality of valve units 30 includes intake valves 30-1 and exhaust valves 30-2, and is arranged on the main printed circuit board 110 so as to be openable and closable.

For example, the valve units 30 may include a first valve unit 31 and a second valve unit 32 that control air intake and exhaust for at least two first air cells 1 installed in a seat cushion, a third valve unit 33 and a fourth valve unit 34 that control air intake and exhaust for second air cells 2 installed in respective bolsters, and a fifth valve unit 35, a sixth valve unit 36, and a seventh valve unit 37 that control air intake and exhaust for at least three third air cells 3 installed in a seat back.

Particularly, the sub-printed circuit board 120 is inserted into the slide hole 111 of the main printed circuit board 110 so as to be capable of moving reciprocally.

For this purpose, the inner perimeter of the slide hole 111 of the main printed circuit board 110 is provided as a slide edge 113, and a slide groove 121, into which the slide edge 113 is inserted, is formed on the outer perimeter of the sub-printed circuit board 120.

Therefore, when the sub-printed circuit board 120 reciprocates rectilinearly, the slide groove 121 comes into contact with the slide edge 113 of the main printed circuit board 110 so that the sub-printed circuit board 120 may slide along the slide edge 113, thereby enabling the sub-printed circuit board 120 to easily reciprocate rectilinearly.

A plurality of pressure sensors 40 is mounted at equal intervals on the sub-printed circuit board 120 by soldering, and the plurality of pressure sensors 40 is provided in a smaller minimum number than the number of the plurality of valve units in consideration of cost reduction due to expensive components.

For example, the pressure sensors 40 may include first to fourth pressure sensors 41, 42, 43, and 44 that are fewer in number than the first to seventh valve units 31, 32, 33, 34, 35, 36, and 37, so as not only to detect air pressure during air intake and exhaust into and from the at least two first air cells 1 installed in the seat cushion and air pressure during air intake and exhaust into and from the second air cells 2 installed in the respective bolsters of the seat, but also to detect air pressure during air intake and exhaust into and from the at least three third air cells 3 installed in the seat back.

At this time, considering that the detection signals of the pressure sensors 40 must be transmitted from the sub-printed circuit board 120 to the main printed circuit board 110, a first conductive pattern 112 is formed on the surface along the slide edge 113 of the main printed circuit board 110, and a second conductive pattern 122 that is conductively in contact with the first conductive pattern 112 is formed on the surface along the slide groove 121 of the sub-printed circuit board 120.

Accordingly, when the sub-printed circuit board 120 reciprocates rectilinearly, the first conductive pattern 112 formed along the slide edge 113 of the main printed circuit board 110 and the second conductive pattern 122 formed on the slide groove 121 of the sub-printed circuit board 120 conductively come into contact with each other so as to be capable of exchanging electrical signals, thereby enabling the detection signals of the pressure sensors 40 to be easily transmitted from the sub-printed circuit board to the main printed circuit board 110.

In some embodiments, dummy blocks 45 having the same height as each pressure sensor 40 are provided between the plurality of pressure sensors 40, i.e., between the first to fourth pressure sensors 41, 42, 43, and 44, on the surface of the sub-printed circuit board 120

The reason why the dummy blocks 45 are formed on the sub-printed circuit board 120 in addition to the first to fourth pressure sensors 41, 42, 43, and 44 is to ensure that sealing members 17 attached to lower ends of pressure sensing passages 16 of air guides 14 that guide air to the pressure sensors 40 are closely attached to the respective pressure sensors 41, 42, 43, and 44 or the dummy blocks 45 so as to maintain airtightness when the sub-printed circuit board 120 reciprocates rectilinearly.

The air guides 14 configured to guide air to the air outlet ports 11 are mounted in the housing 10, air flow paths 15 that communicate with the air outlet ports 11 are formed between the air guides 14 and the inner wall of the housing 10, and particularly, as shown in FIG. 3, the pressure sensing passages 16 to guide air to the respective pressure sensors 40 are formed at predetermined positions of the air guides 14, and the sealing members 17 that are in close contact with the respective pressure sensors 41, 42, 43, and 44 to maintain air tightness thereof are attached to the lower ends of the pressure sensing passages 16.

Accordingly, before air is supplied to one or more of the first air cells 1, the second air cells 2, and the third air cells 3, when air fills one or more of the first air cells 1, the second air cells 2, and the third air cells 3, and when air is exhausted from one or more of the first air cells 1, the second air cells 2, and the third air cells 3, air flows into the pressure sensing passages 16 by the sealing members 17, thereby enabling the first to fourth pressure sensors 41, 42, 43, and 44 to detect air pressure.

In a state in which the dummy blocks 45 are not formed on the sub-printed circuit board 120, if the sub-printed circuit board 120 reciprocates rectilinearly and the first to fourth pressure sensors 41, 42, 43, and 44 mounted on the sub-printed circuit board 120 also move together with the sub-printed circuit board 120 and deviate from the sealing members 17, objects with which the sealing members 17 are in close contact are removed, and thus, the sealing members 17 may be separated.

On the other hand, in a state in which the dummy blocks 45 are formed on the sub-printed circuit board 120, even if the sub-printed circuit board 120 reciprocates rectilinearly and the first to fourth pressure sensors 41, 42, 43, and 44 mounted on the sub-printed circuit board 120 also move together with the sub-printed circuit board 120 and deviate from the sealing members 17, the sealing members 17 are in close contact with the dummy blocks 45 between the respective pressure sensors 41, 42, 43, and 44, and thus, separation of the sealing members 17 may be prevented and the sealing members 17 may be protected.

As a driving unit for rectilinear reciprocation of the sub-printed circuit board 120, an actuator 130 that is driven to push the sub-printed circuit board 120 in one direction or pull the sub-printed circuit board 120 in the other direction is mounted on the main printed circuit board 110.

In some embodiments, the actuator 130 may employ a solenoid valve-type actuator that includes a plunger 131 connected to the sub-printed circuit board 120 to be driven forward and backward.

That is, the actuator 130 may employ a solenoid valve-type actuator that moves backward while the plunger 131 is pulled by a magnetic field due to application of current, and moves forward while the plunger 131 is pushed by elastic restoring force of a spring installed in the actuator 130 when the current is released.

In addition, as shown in FIG. 5, in order to enable the sub-printed circuit board to reciprocate rectilinearly, a fastening bracket 123 is mounted at the front end of the sub-printed circuit board 120 so that the plunger 131 of the actuator 130 is fastened to the fastening bracket 123.

In detail, the fastening bracket 123 of the sub-printed circuit board 120 and the plunger 131 of the actuator 130 are connected to each other by inserting a pair of fastening ends 124 formed on the upper end of the fastening bracket 123 into a fastening groove 132 formed on the outer circumferential surface of the plunger 131.

Accordingly, by pulling the fastening bracket 123 while the plunger 131 of the actuator 130 is pulled, the rectilinear forward movement of the sub-printed circuit board 120 may be achieved, and by pushing the fastening bracket 123 while the plunger 131 of the actuator 130 is pushed, the rectilinear backward movement of the sub-printed circuit board 120 to an original position thereof (a position before forward movement) may be achieved.

Figure 9:
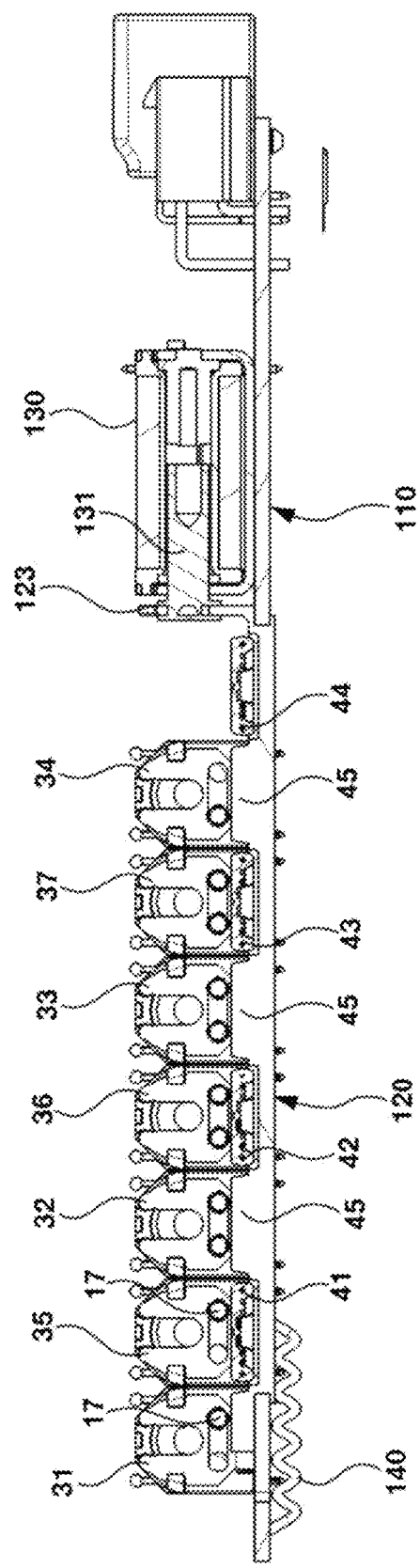
FIG. 9 is a longitudinal-sectional view taken along line D-D of FIG. 8, illustrating the state before the position of the pressure sensors of the pneumatic controller for vehicle seats according to the present disclosure has been moved.

As shown in FIGS. 7 and 9, a spring 140 that provides elastic restoring force when the sub-printed circuit board 120 returns to the original position thereof (moves backward rectilinearly) is connected between the bottom surface of the main printed circuit board 110 and the bottom surface of the sub-printed circuit board 120, thereby enabling the sub-printed circuit board 120 to completely return to the original position (the position before forward movement) by the elastic restoring force of the spring 140.

Here, the operating flow of the pneumatic controller for vehicle seats of the present disclosure having the above-described configuration is as follows.

FIG. 6 is a cross-sectional view illustrating a state before the position of the pressure sensors of the pneumatic controller for vehicle seats according to the present disclosure is moved, and FIG. 7 is a longitudinal-sectional view taken along line C-C of FIG. 6.

Air Filling and Exhaust Operation of First Air Cells

Referring to FIGS. 6 and 7, if the sub-printed circuit board 120 is pushed by the plunger 131 of the actuator 130 and placed at the original position before slide movement, the first pressure sensor 41 and the second pressure sensor 42 among the plurality of pressure sensors 40 mounted on the sub-printed circuit board 120 are arranged to be in communication with the air outlets of the first valve unit 31 and the second valve unit 32 among the plurality of valve units 30 so as to detect air pressure during air intake and exhaust into and from the first air cells 1 installed in the seat cushion.

Accordingly, when air fills the first air cells 1, the air having passed through the first valve unit 31 and the second valve unit 32 also flows into the pressure sensing passages 16, thereby enabling the first pressure sensor 41 and the second pressure sensor 42 to detect air pressure.

In detail, the first pressure sensor 41 and the second pressure sensor 42 detect air pressure before the first air cells 1 are filled with a set amount of air and air pressure after the first air cells 1 have been filled with the set amount of air in real time, and transmit a detection signal from the sub-printed circuit board 120 to the main printed circuit board 110.

Accordingly, when air is exhausted from the first air cells 1, the exhaust valves 30-2 of the first valve unit 31 and the second valve unit 32 may be opened for air exhaust and the opening operation time of the exhaust valves 30-2 may be controlled to be limited by a control signal from the main printed circuit board 110.

For example, the opening operation time of the exhaust valves 30-2 may be limited until the first pressure sensor 41 and the second pressure sensor 42 detect a pre-detected air pressure (e.g., air pressure detected before the first air cells 1 are filled with the set amount of air).

In other words, after the exhaust valves 30-2 of the first valve unit 31 and the second valve unit 32 have been opened for air exhaust, when the air pressure detected in real time by the first pressure sensor 41 and the second pressure sensor 42 reaches the pre-detected air pressure (e.g., the air pressure detected before the first air cells 1 are filled with the set amount of air), the exhaust valves 30-2 of the first valve unit 31 and the second valve unit 32 are controlled to be closed by the control signal from the main printed circuit board 110.

Therefore, the amount of expansion of the seat cushion depending on air intake into the first air cells 1 and the amount of contraction of the seat cushion depending on air exhaust from the first air cells 1 are controlled to be the same, and thus, the seat cushion may accurately return to an original position thereof (a state before expansion) after being expanded.

Air Filling and Exhaust Operation of Second Air Cells

Referring to FIGS. 6 and 7, if the sub-printed circuit board 120 is pushed by the plunger 131 of the actuator 130 and placed at the original position before slide movement, the third pressure sensor 43 and the fourth pressure sensor 44 among the plurality of pressure sensors 40 mounted on the sub-printed circuit board 120 are arranged to be in communication with the air outlets of the third valve unit 33 and the fourth valve unit 34 among the plurality of valve units 30 so as to detect air pressure during air intake and exhaust into and from the second air cells 2 installed in the respective bolsters.

Accordingly, when air fills the second air cells 2, air having passed through the third valve unit 33 and the fourth valve unit 34 also flows into the pressure sensing passages 16, thereby enabling the third pressure sensor 43 and the fourth pressure sensor 44 among the pressure sensors 40 to detect air pressure.

In detail, among the pressure sensors 40, the third pressure sensor 43 and the fourth pressure sensor 44 detect air pressure before the second air cells 2 are filled with a set amount of air and air pressure after the second air cells 2 have been filled with the set amount of air in real time, and transmit a detection signal from the sub-printed circuit board 120 to the main printed circuit board 110.

Accordingly, when air is exhausted from the second air cells 2, the exhaust valves 30-2 of the third valve unit 33 and the fourth valve unit 34 may be opened for air exhaust and the opening operation time of the exhaust valves 30-2 may be controlled to be limited by a control signal from the main printed circuit board 110.

For example, the opening operation time of the exhaust valves 30-2 may be limited until the third pressure sensor 43 and the fourth pressure sensor 44 detect a pre-detected air pressure (e.g., air pressure detected before the second air cells 2 are filled with the set amount of air).

In other words, after the exhaust valves 30-2 of the third valve unit 33 and the fourth valve unit 34 have been opened for air exhaust, when the air pressure detected in real time by the third pressure sensor 43 and the fourth pressure sensor 44 reaches the pre-detected air pressure (e.g., the air pressure detected before the second air cells 2 are filled with the set amount of air), the exhaust valves 30-2 of the third valve unit 33 and the fourth valve unit 34 are controlled to be closed by the control signal from the main printed circuit board 110.

Therefore, the amount of expansion of the bolsters depending on air intake into the second air cells 2 and the amount of contraction of the bolsters depending on air exhaust from the second air cells 2 are controlled to be the same, and thus, the bolsters may accurately return to original positions thereof (a state before expansion) after being expanded.

Air Filling and Exhaust Operation of Third Air Cells

Figure 8:
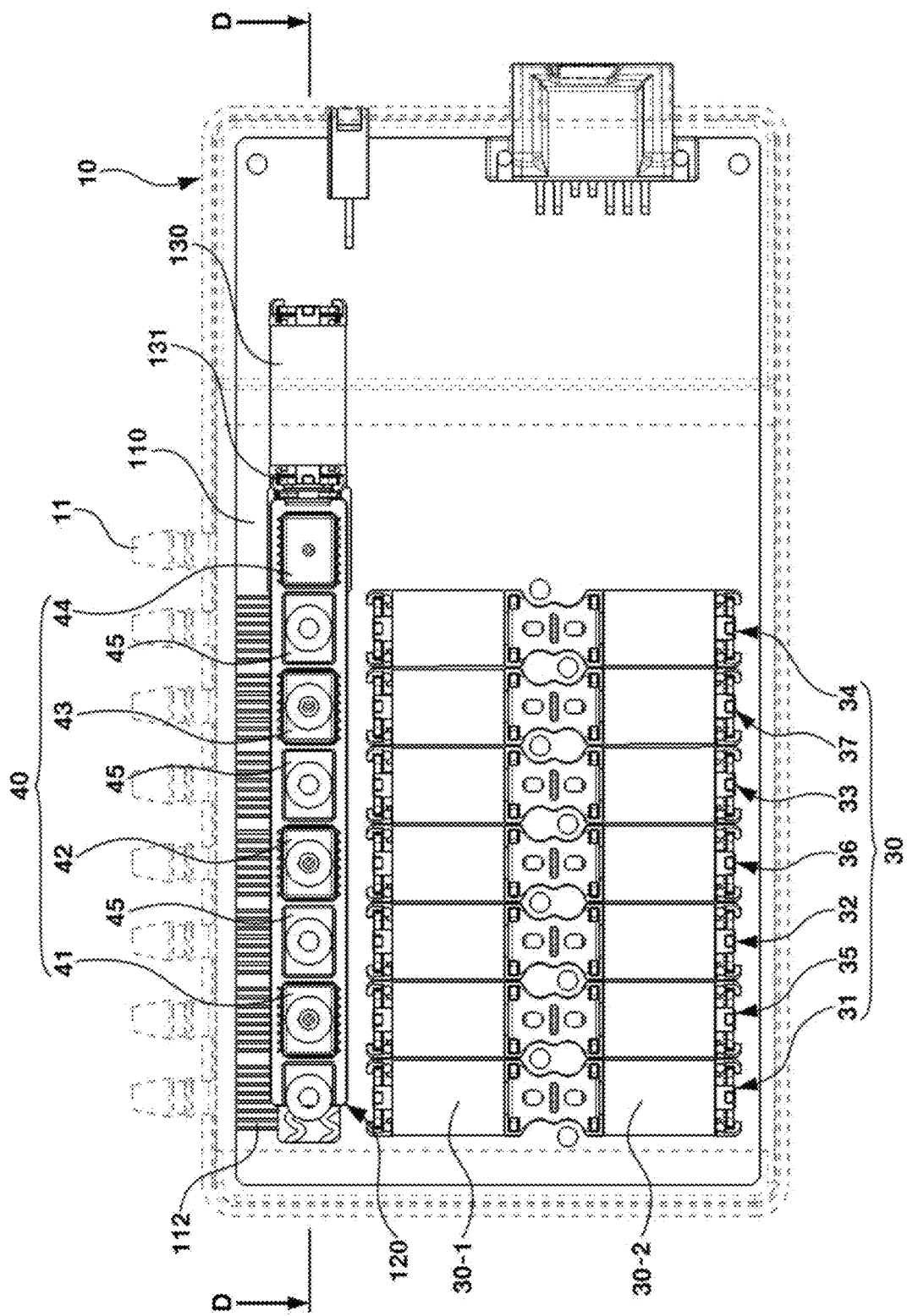
FIG. 8 is a cross-sectional view illustrating a state after the position of the pressure sensors of the pneumatic controller for vehicle seats according to the present disclosure has been moved.

FIG. 8 is a cross-sectional view illustrating a state after the position of the pressure sensors of the pneumatic controller for vehicle seats according to the present disclosure has been moved, and FIG. 9 is a longitudinal-sectional view taken along line D-D of FIG. 8.

As shown in FIGS. 8 and 9, if the sub-printed circuit board 120 is pulled to slide by a set distance by the plunger 131 of the actuator 130 and placed at a forward moved position, the first pressure sensor 41, the second pressure sensor 42, and the third pressure sensor 43 among the plurality of pressure sensors 40 mounted on the sub-printed circuit board 120 are arranged to be in communication with the air outlets of the fifth valve unit 35, the sixth valve unit 36, and the seventh valve unit 37 among the plurality of valve units 30 so as to detect air pressure during air intake and exhaust into and from the third air cells 3 installed in the seat back.

Accordingly, when air fills the third air cells 3, air having passed through the fifth valve unit 35, the sixth valve unit 36, and the seventh valve unit 37 also flows into the pressure sensing passages 16, thereby enabling the first pressure sensor 41, the second pressure sensor 42, and third pressure sensor 43 to detect air pressure.

In detail, among the pressure sensors 40, the first pressure sensor 41, the second pressure sensor 42, and the third pressure sensor 43 detect air pressure before the third air cells 3 are filled with a set amount of air and air pressure after the third air cells 3 have been filled with the set amount of air in real time, and transmit a detection signal from the sub-printed circuit board 120 to the main printed circuit board 110.

Accordingly, when air is exhausted from the third air cells 3, the exhaust valves 30-2 of the fifth valve unit 35, the sixth valve unit 36, and the seventh valve unit 37 may be opened for air exhaust and the opening operation time of the exhaust valves 30-2 may be controlled to be limited by a control signal from the main printed circuit board 110.

For example, the opening operation time of the exhaust valves 30-2 may be limited until the first pressure sensor 41, the second pressure sensor 42, and the third pressure sensor 43 detect a pre-detected air pressure (e.g., air pressure detected before the third air cells 3 are filled with the set amount of air).

In other words, after the exhaust valves 30-2 of the fifth valve unit 35, the sixth valve unit 36, and the seventh valve unit 37 have been opened for air exhaust, when the air pressure detected in real time by the first pressure sensor 41, the second pressure sensor 42, and the third pressure sensor 43 reaches the pre-detected air pressure (e.g., the air pressure detected before the third air cells 3 are filled with the set amount of air), the exhaust valves 30-2 of the fifth valve unit 35, the sixth valve unit 36, and the seventh valve unit 37 are controlled to be closed by the control signal from the main printed circuit board 110.

Therefore, the amount of expansion of the lumbar support of the seat back depending on air intake into the third air cells 3 and the amount of contraction of the lumbar support of the seat back depending on air exhaust from the third air cells 3 are controlled to be the same, and thus, the lumbar support of the seat back may accurately return to an original position thereof (a state before expansion) after being expanded.

As such, the pressure sensors 40 mounted on the sub-printed circuit board 120 may be moved to a position where the pressure sensors 40 are capable of sensing air pressure, thereby being capable of easily detecting not only air pressure during air intake and exhaust into and from the first air cells 1 installed in the seat cushion and air pressure during air intake and exhaust into and from the second air cells 2 installed in the respective bolsters, but also air pressure during air intake and exhaust into and from the third air cells 3 installed in the seat back.

As is apparent from the above description, the present disclosure provides the following effects.

First, the arrangement position of pressure sensors mounted on a sub-printed circuit board of a pneumatic controller may be moved to a position where the pressure sensors are capable of sensing air pressure, thereby being capable of minimizing the number of the expensive pressure sensors mounted on the pneumatic controller and thus achieving cost reduction.

Second, a plunger of an actuator pulls or pushes the printed circuit board by a switching signal for Ergo Motion, and thus the pressure sensors mounted on the printed circuit board may be moved to a position to detect air pressure during air intake and exhaust into and from first air cells installed in a seat cushion and second air cells installed in bolsters, or a position to detect air pressure during air intake and exhaust into and from third air cells installed in a seat back, thereby being capable of easily detecting air pressure during air intake and exhaust into and from any air cells with only the minimum number of pressure sensors.

Although the present disclosure has been described in detail with reference to one embodiment, the scope of the present disclosure is not limited to the above-described embodiment, and it is to be understood that various modifications and improvements made by those skilled in the art using the basic concept of the present disclosure defined in the following claims are also within the scope of the present disclosure.

What is claimed is:
1. A pneumatic controller for at least one vehicle seat comprising:

a housing including a plurality of air outlet ports formed on one side thereof;
a main printed circuit board including a structure provided with a slide hole formed thereon, and mounted in the housing;
a plurality of valve units arranged on the main printed circuit board so as to be openable and closable;
a sub-printed circuit board inserted into the slide hole to be movable rectilinearly;
a plurality of pressure sensors provided fewer in number than the plurality of valve units and mounted at predetermined intervals on the sub-printed circuit board; and
an actuator mounted on the main printed circuit board to push the sub-printed circuit board in one direction or pull the sub-printed circuit board in an opposite direction.

2. The pneumatic controller of claim 1, wherein the slide hole of the main printed circuit board is formed to be open-ended on one side so that the sub-printed circuit board is insertable thereinto.

3. The pneumatic controller of claim 2, wherein an inner perimeter of the slide hole of the main printed circuit board is provided as a slide edge, and a slide groove is formed on an outer perimeter of the sub-printed circuit board so that the slide edge is insertable thereinto.

4. The pneumatic controller of claim 3, wherein a first conductive pattern is formed on a surface along the slide edge of the main printed circuit board, and a second conductive pattern is formed along the outer perimeter of the sub-printed circuit board so as to be conductively in contact with the first conductive pattern when the sub-printed circuit board is inserted into the slide hole.

5. The pneumatic controller of claim 1, the pneumatic controller further comprising dummy blocks having the same height as the plurality of pressure sensors and configured to be provided between the plurality of pressure sensors on a surface of the sub-printed circuit board.

6. The pneumatic controller of claim 5, further comprising sealing members and air guides configured to guide air to the pressure sensors and including pressure sensing passages, and wherein the sealing members are attached to lower ends of the pressure sensing passages of the air guides, and the sealing members are configured to be in close contact with the pressure sensors or the dummy blocks to maintain airtightness when the sub-printed circuit board is moved rectilinearly.

7. The pneumatic controller of claim 1, wherein the actuator is a solenoid valve-type actuator comprising a plunger connected to the sub-printed circuit board to be driven forward or backward.

8. The pneumatic controller of claim 7, further comprising a fastening bracket configured to be mounted at a front end of the sub-printed circuit board so that the plunger is fastenable thereto.

9. The pneumatic controller of claim 8, further comprising a pair of fastening ends formed on an upper end of the fastening bracket, and a fastening groove formed along an outer circumferential surface of the plunger so that the pair of fastening ends is insertable thereinto.

10. The pneumatic controller of claim 1, further comprising a spring configured to provide an elastic restoring force when the sub-printed circuit board is moved to return to an original position thereof, the spring connected between a bottom surface of the main printed circuit board and a bottom surface of the sub-printed circuit board.

11. The pneumatic controller of claim 1, wherein, when the sub-printed circuit board is pushed by the actuator and brought back to an original position where the sub-printed circuit board was located before being moved, a first pressure sensor and a second pressure sensor among the plurality of pressure sensors mounted on the sub-printed circuit board are arranged to be aligned with air outlets of a first valve unit and a second valve unit among the plurality of valve units so as to detect air pressure during air intake and exhaust into and from first air cells installed in a seat cushion, and a third pressure sensor and a fourth pressure sensor among the plurality of pressure sensors mounted on the sub-printed circuit board are arranged to be aligned with air outlets of a third valve unit and a fourth valve unit among the plurality of valve units so as to detect air pressure during air intake and exhaust into and from second air cells.

12. The pneumatic controller of claim 1, wherein, when the sub-printed circuit board is pulled by the actuator and placed at a different position offset by a set distance from an original position, a first pressure sensor, a second pressure sensor, and a third pressure sensor among the plurality of pressure sensors mounted on the sub-printed circuit board are arranged to be aligned with air outlets of a fifth valve unit, a sixth valve unit, and a seventh valve unit respectively among the plurality of valve units so as to detect air pressure during air intake and exhaust into and from third air cells.

* * * * *